United States Patent
Hane et al.

(10) Patent No.: US 10,438,791 B2
(45) Date of Patent: Oct. 8, 2019

(54) FILM FORMING METHOD, FILM FORMING APPARATUS, AND STORAGE MEDIUM

(71) Applicant: TOKYO ELECTRON LIMITED, Tokyo (JP)

(72) Inventors: Hideomi Hane, Nirasaki (JP); Kentaro Oshimo, Nirasaki (JP); Shimon Otsuki, Oshu (JP); Jun Ogawa, Nirasaki (JP); Noriaki Fukiage, Nirasaki (JP); Hiroaki Ikegawa, Nirasaki (JP); Yasuo Kobayashi, Nirasaki (JP); Takeshi Oyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/005,072

(22) Filed: Jun. 11, 2018

(65) Prior Publication Data

US 2018/0366315 A1 Dec. 20, 2018

(30) Foreign Application Priority Data

Jun. 15, 2017 (JP) .................................. 2017-117884

(51) Int. Cl.
*H01L 21/00* (2006.01)
*H01L 21/02* (2006.01)
(Continued)

(52) U.S. Cl.
CPC ........ *H01L 21/0217* (2013.01); *C23C 16/345* (2013.01); *C23C 16/4584* (2013.01); *C23C 16/45536* (2013.01); *C23C 16/45542* (2013.01); *C23C 16/45544* (2013.01); *C23C 16/45551* (2013.01); *C23C 16/45553* (2013.01); *C23C 16/46* (2013.01); *C23C 16/511* (2013.01); *C23C 16/52* (2013.01); *H01J 37/3222* (2013.01);
(Continued)

(58) Field of Classification Search
CPC .......... H01L 21/0217; H01L 21/02274; H01L 21/68784; H01L 21/02211; H01L 21/0228
See application file for complete search history.

(56) References Cited

U.S. PATENT DOCUMENTS

| 4,764,248 A | * | 8/1988 | Bhattacherjee | ..... H01L 21/3144 438/439 |
| 5,258,333 A | * | 11/1993 | Shappir | ............... H01L 21/3144 438/762 |

FOREIGN PATENT DOCUMENTS

| JP | 5247781 B2 | 4/2013 |
| JP | 2014154630 A | 8/2014 |

* cited by examiner

*Primary Examiner* — Richard A Booth
(74) *Attorney, Agent, or Firm* — Nath, Goldberg & Meyer; Jerald L. Meyer

(57) ABSTRACT

A film forming process of forming a silicon nitride film by depositing a molecular layer of silicon nitride on a surface of a substrate, in which an uneven pattern is formed and a base made of metal reacting with halogen is exposed, includes alternately performing adsorbing silicon halide to the surface of the substrate and nitriding the silicon halide, wherein the film forming process is performed under a condition in which the substrate is heated at a film-forming temperature, the film-forming temperature falling within a range of equal to or higher than a minimum film-forming temperature at which the molecular layer of the silicon nitride is formed by reaction of the silicon halide and a plasmarized nitriding gas and less than a maximum film-forming temperature at which the reaction of the base made of metal and the silicon halide goes ahead.

7 Claims, 10 Drawing Sheets

(51) Int. Cl.
*H01L 21/687* (2006.01)
*H01J 37/32* (2006.01)
*C23C 16/34* (2006.01)
*C23C 16/455* (2006.01)
*C23C 16/458* (2006.01)
*C23C 16/46* (2006.01)
*C23C 16/52* (2006.01)
*C23C 16/511* (2006.01)

(52) U.S. Cl.
CPC .... *H01J 37/32715* (2013.01); *H01L 21/0228* (2013.01); *H01L 21/02211* (2013.01); *H01L 21/02274* (2013.01); *H01L 21/68764* (2013.01); *H01L 21/68771* (2013.01); *H01J 37/3244* (2013.01); *H01J 2237/20214* (2013.01); *H01J 2237/3321* (2013.01)

US 10,438,791 B2

FILM FORMING METHOD, FILM FORMING APPARATUS, AND STORAGE MEDIUM

CROSS-REFERENCE TO RELATED APPLICATION(S)

This application is based upon and claims the benefit of priority from Japanese Patent Application No. 2017-117884, filed on Jun. 15, 2017, the entire contents of which are incorporated herein by reference.

TECHNICAL FIELD

The present disclosure relates to a technique of forming a silicon nitride film on a surface of a substrate on which an uneven pattern is formed.

BACKGROUND

In manufacturing processes of a semiconductor device, there is a process of forming a silicon nitride film (hereinafter, often abbreviated as a "SiN film") on a surface of a substrate such as a semiconductor wafer (hereinafter, referred to as a "wafer") on which an uneven (or concave and convex) pattern is formed.

The SiN film is used as, for example, a hard mask for an etching process, a spacer insulating film, a sealing film, or the like (collectively, referred to as a "protective film"). The SiN film for such uses needs to have good step coverage (SC) and small wet etching rate (WER) with respect to an uneven pattern.

In order to obtain a SiN film having good SC and small WER, it is desirable to perform a film forming process at a higher temperature to form a dense SiN film.

Moreover, when the film forming process is performed at a high temperature, a problem may occur in a raw material of the SiN film due to interaction with a substance in a base of the SiN film. As mentioned above, there may be a trade-off relationship between the film forming process at a high temperature to obtain good film quality and suppression of interaction with the substances in the base of the SiN film.

For example, in a related art, there is a method in which a silicon nitride film (SiN film) is formed on a semiconductor wafer by reaction of dichlorosilane and ammonia radical in a reaction chamber set at a temperature within a range of 200 to 410 degrees C., for example, at 400 degrees C. However, the aforementioned method does not include a technique of forming an SiN film having good film quality while taking into consideration interaction with a base of the SiN film.

SUMMARY

Some embodiments of the present disclosure provide a film forming method capable of forming a silicon nitride film with good film quality while suppressing occurrence of interaction with a base of the silicon nitride film, a film forming apparatus, and a storage medium storing the film forming method.

According to one embodiment of the present disclosure, a method of forming a silicon nitride film includes a film forming process of forming the silicon nitride film by depositing a molecular layer of silicon nitride on a surface of a substrate, in which an uneven pattern is formed and a base made of metal reacting with halogen is exposed, by alternately performing: adsorbing silicon halide to the surface of the substrate by supplying a raw material gas containing silicon halide to the surface of the substrate; and nitriding the silicon halide by supplying a plasmaized nitriding gas to the surface of the substrate to which the silicon halide is adsorbed. The film forming process is performed under a condition in which the substrate is heated at a film-forming temperature, the film-forming temperature falling within a range of equal to or higher than a minimum film-forming temperature at which the molecular layer of the silicon nitride is formed by reaction of the silicon halide and the plasmarized nitriding gas and less than a maximum film-forming temperature at which the reaction of the base made of metal and the silicon halide goes ahead. The act of nitriding the silicon halide is performed over a time equal to or longer than a minimum nitridation time, the minimum nitridation time satisfying at least one of (i) making a step coverage (SC) of the silicon nitride film for the uneven pattern be a value within a predetermined SC value range and (ii) making a wet etching rate (WER) of the silicon nitride film be a value equal to or less than a predetermined WER upper limit value.

According to another embodiment of the present disclosure, a film forming apparatus for forming a silicon nitride film includes a rotary table, a raw material gas supply part, a gas injector, a nitriding gas exhaust port, a plasma generating part, a heating part, and a controller. The rotary table has a substrate mounting region on which a substrate, in which an uneven pattern is formed and a base made of metal reacting with halogen is exposed, is mounted, and is configured to rotate around a center of rotation so as to revolve the substrate mounted on the substrate mounting region around the center of rotation. The raw material gas supply part faces the rotary table and has a discharge part configured to discharge a raw material gas containing silicon halide and an exhaust port surrounding the discharge part. The gas injector is installed at a position spaced apart from the raw material gas supply part in a direction in which the substrate mounted on the substrate mounting region revolves, and has a discharge port formed along a longitudinal direction of the gas injector, the gas injector being arranged so as to intersect with a region through which the substrate mounted on the substrate mounting region passes. The nitriding gas exhaust port is installed at an outer side of the rotary table and at a position spaced apart from the position of the gas injector toward an upstream side or a downstream side in a direction of revolution of the substrate. The plasma generating part is configured to plasmarize a nitriding gas flowing through a nitridation region between the gas injector and the nitriding gas exhaust port. The heating part is configured to heat the substrate at a film-forming temperature, the film-forming temperature falling within a range of equal to or higher than a minimum film-forming temperature at which a molecular layer of the silicon nitride is formed by reaction of the silicon halide and the plasmarized nitriding gas and less than a maximum film-forming temperature at which the reaction of the base made of the metal and the silicon halide goes ahead. The controller is configured to control a rotation number of the rotary table per unit time such that the substrate mounted on the substrate mounting region passes through the nitridation region over a time equal to longer than a minimum nitridation time with respect to the silicon nitride film formed by depositing the molecular layer of the silicon nitride, that the minimum nitridation time satisfying at least one of (i) making a step coverage (SC) of the silicon nitride film for the uneven pattern be a value within a predetermined SC value range and (ii) making a wet etching rate (WER) of the silicon nitride film be a value equal to or less than a predetermined WER upper limit value.

According to another embodiment of the present disclosure, there is provided a non-transitory computer-readable storage medium storing a computer program for use in a film forming apparatus for forming a silicon nitride film on a substrate arranged in a vacuum container. The computer program is configured to perform a control to execute the above-described method of forming a silicon nitride film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In an embodiment, a method of forming a silicon nitride film of the present disclosure is applied to a semibatch-type film forming apparatus 1 having a rotary table 12, on which a plurality of wafers W are mounted, disposed in a vacuum container 11 to perform a film forming process. A configuration of the apparatus will be described with reference to a longitudinal sectional view of FIG. 1 and a transverse plan view of FIG. 2.

In the film forming apparatus 1 of this example, a SiN film is formed on a surface of a wafer W having a diameter of, for example, 300 mm, as a substrate by an atomic layer deposition (ALD) method. An uneven pattern is formed on the surface (upper surface) of the wafer W, and a SiN film is formed on the uneven pattern (see FIGS. 9A to 9C of Experiment 1 to be described later). The SiN film is used as, for example, a hard mask for an etching process, a spacer insulating film, a sealing film, or the like. In the present disclosure, the silicon nitride film will be described as SiN regardless of stoichiometric ratio of Si and N. Therefore, the description of SiN includes, for example, $Si_3N_4$.

Figure 1:
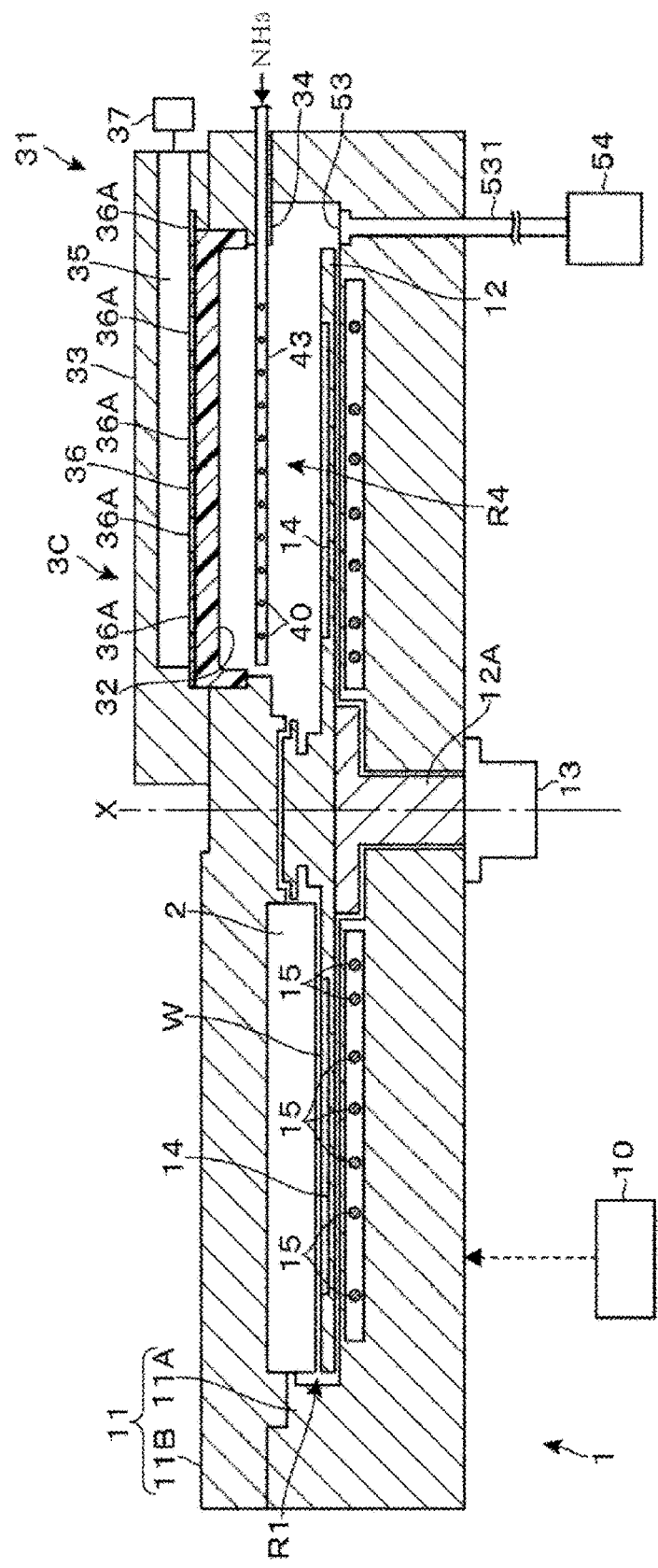
FIG. 1 is a longitudinal sectional view of a film forming apparatus according to an embodiment of the present disclosure.

As illustrated in FIG. 1, the film forming apparatus 1 includes the vacuum container 11 and the rotary table 12 installed in a horizontal posture in the vacuum container 11 and having a disc shape.

The vacuum container 11 is configured by a container body 11A forming a sidewall and a bottom portion of the vacuum container 11, and a ceiling plate 11B, and has a flat shape with a substantially circular plane.

The rotary table 12 has a radius of, for example, about 550 mm, and is connected to a rotation mechanism 13 via a support part 12A that supports the central part on a rear surface side of the rotary table 12. The rotation mechanism 13 can rotate the rotary table 12 around a rotary axis X in the vacuum container 11, for example, in a clockwise direction.

In the following description, the direction along the rotational direction of the rotary table 12 when viewed from a predetermined reference position may also be referred to as "a downstream side in the rotational direction", and its opposite direction may also be referred to as "an upstream side in the rotational direction".

For example, six circular recesses 14 are installed on the upper surface of the rotary table 12 so as to be spaced apart from each other along the rotational direction of the rotary table 12, and the wafer W is accommodated in each of the recesses 14. These recesses 14 constitute a mounting region of the wafers W. When the rotary table 12 is rotated, the wafers W arranged in the respective recesses 14 revolve around the rotary axis X.

A heater 15 made of a carbon wire or the like may be disposed below the rotary table 12 to heat the wafers W mounted on the rotary table 12.

Figure 2:
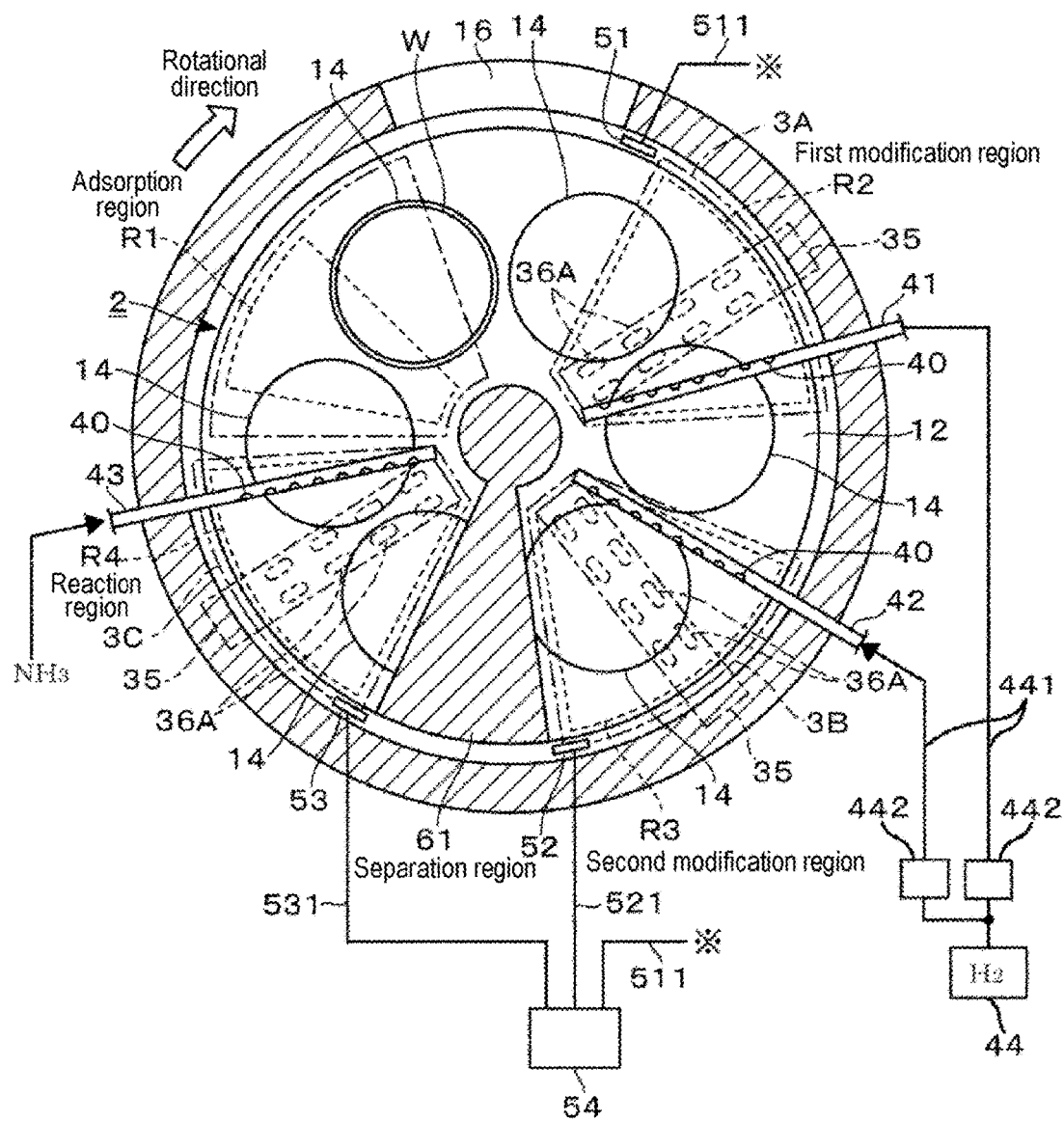
FIG. 2 is a transverse plan view of the film forming apparatus.

As illustrated in FIG. 2, a transfer port 16 of the wafers W which is opened and closed by a gate valve (not shown) is installed on the sidewall of the vacuum container 11, and loading/unloading of the wafers W between an external substrate transfer mechanism (not shown) and the recesses 14 is performed using the transfer port 16.

As illustrated in FIG. 2, an adsorption region R1 of a raw material gas, a first modification region R2, a second modification region R3, and a reaction region R4 are sequentially arranged in a space above the rotary table 12 along the rotational direction of the rotary table 12.

The raw material gas is supplied to the adsorption region R1 via a gas supply/exhaust unit 2 forming a raw material gas supply part.

Figure 3:
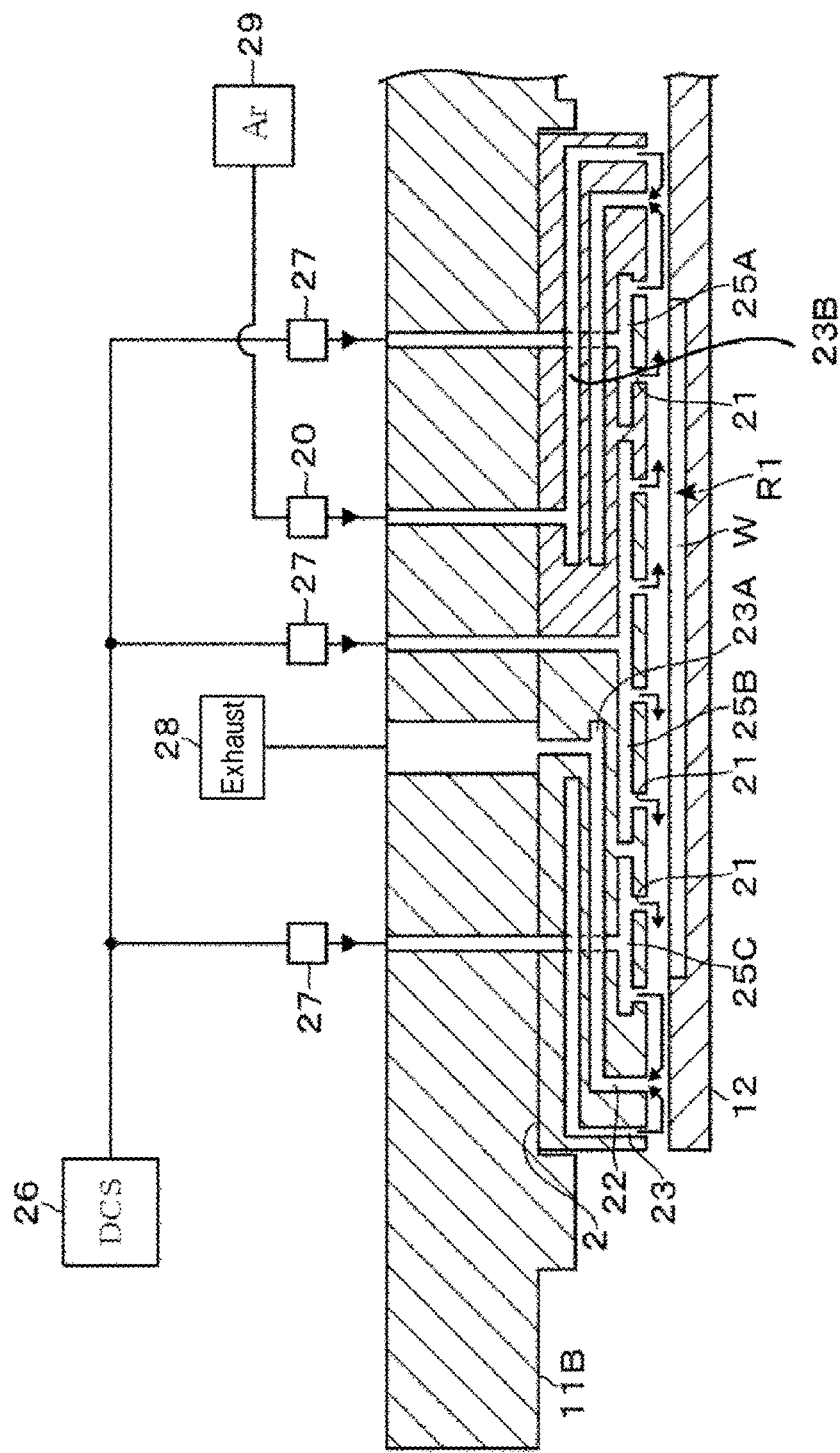
FIG. 3 is a longitudinal sectional view of a gas supply/exhaust unit of the film forming apparatus.
Figure 4:
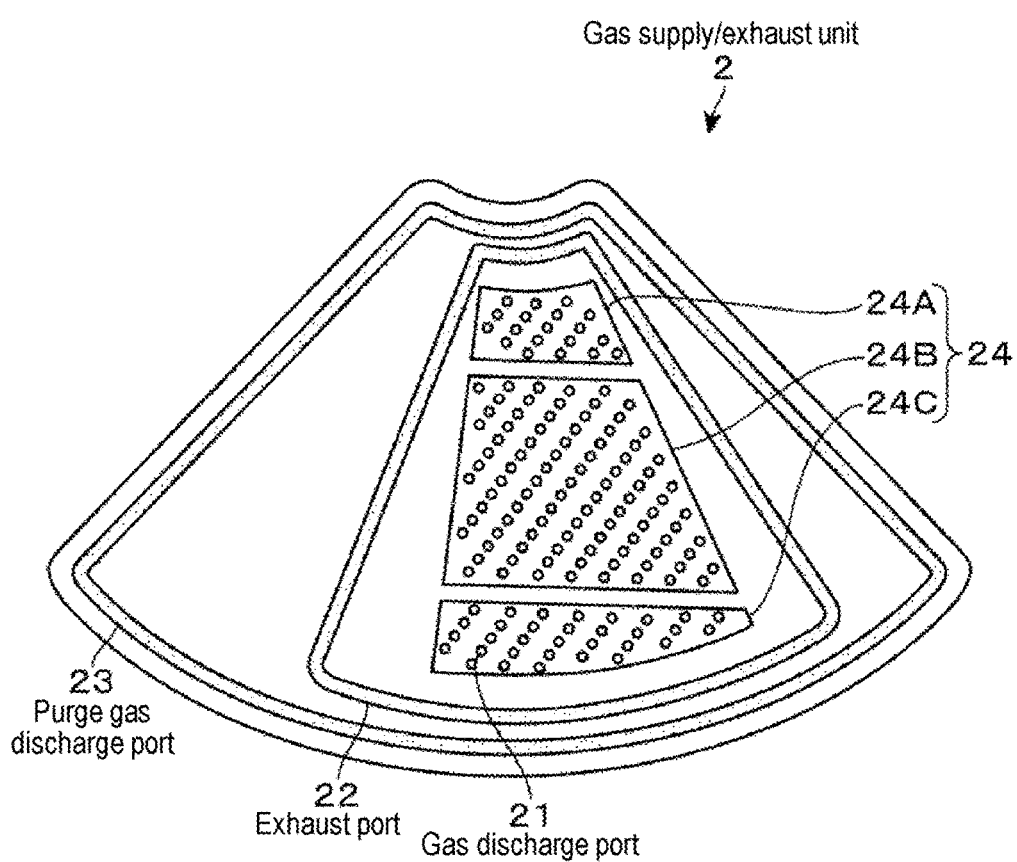
FIG. 4 is a plan view of the gas supply/exhaust unit when viewed from a lower surface side.

As illustrated in FIG. 3 which is a longitudinal sectional view of the gas supply/exhaust unit 2 and FIG. 4 which is a bottom view of the gas supply/exhaust unit 2, in a plan view, the gas supply/exhaust unit 2 has a fan shape which laterally widens from the central side of the rotary table 12 toward the peripheral side of the rotary table 12. A lower surface of the gas supply/exhaust unit 2 is arranged to face the upper surface of the rotary table 12, and a gap is formed between the lower surface of the gas supply/exhaust unit 2 and the upper surface of the rotary table 12.

A plurality of gas discharge ports 21 forming a discharge part of the raw material gas, an exhaust port 22 for exhausting the raw material gas discharged from the gas discharge ports 21, and a purge gas discharge port 23 for supplying a purge gas, which partitions a region where the gas discharge ports 21 and the exhaust port 22 are installed from the surroundings, are installed in the lower surface of the gas supply/exhaust unit 2. For ease of identification in the drawing, the exhaust port 22 and the purge gas discharge port 23 are indicated by dot hatching in FIG. 4.

As illustrated in FIG. 4, the plurality of gas discharge ports 21 is arranged inside the fan-shaped contour when viewed from the lower surface side of the gas supply/exhaust unit 2. The gas discharge ports 21 are formed in an entire fan-shaped region 24 which is divided into three sections 24A, 24B, and 24C.

These sections 24A, 24B, and 24C are partitioned from the central side of the rotary table 12 toward the peripheral side of the rotary table 12. The raw material gas is supplied to the gas discharge ports 21 installed in the respective sections 24A, 24B, and 24C via different gas flow paths 25A, 25B, and 25C, as illustrated in FIG. 3.

A gas supply device 27 including an opening/closing valve and a mass flow controller, which enable independent control of supply/stop of the raw material gas and a flow rate of the raw material gas with respect to these gas flow paths 25A, 25B, and 25C, is installed at the upstream side of each of the gas flow paths 25A, 25B, and 25C. At the upstream side of each of the gas supply devices 27, the flow paths are joined and connected to a common raw material gas supply source 26.

A raw material gas containing silicon halide, which is a compound of silicon (Si) as a raw material of the SiN film and halogen, is supplied from the raw material gas supply source 26 to the wafers W mounted on the rotary table 12. For example, the raw material gas contains at least one silicon halide selected from a group of silicon halides consisting of dichlorosilane (DCS), hexachlorodisilane (HCD), tetrachlorosilane (TCS), and trichlorosilane (TrCS).

In the present embodiment, an example of supplying a raw material gas containing DCS from the raw material gas supply source 26 will be described.

As illustrated in FIG. 4, the exhaust port 22 and the purge gas discharge port 23 which are band-shaped openings surrounding the aforementioned fan-shaped region 24 are installed on the lower surface side of the gas supply/exhaust unit 2 sequentially from the inside. A region above the rotary table 12 surrounded by the exhaust port 22 constitutes the adsorption region R1 where adsorption of DCS to the surface of the wafers W is performed.

As illustrated in FIG. 3, a gas flow path 23B for supplying, for example, an Ar (argon) gas as a purge gas toward the purge gas discharge port 23, and a gas flow path 23A through which the raw material gas or the argon gas discharged toward the exhaust port 22 flows are formed in the gas supply/exhaust unit 2.

An Ar gas supply source 29 is connected to the upstream side of the gas flow path 23B via a gas supply device 20 including an opening/closing valve and a mass flow controller. Furthermore, the downstream side of the gas flow path 23A is connected to an exhaust device 28.

Figure 6:
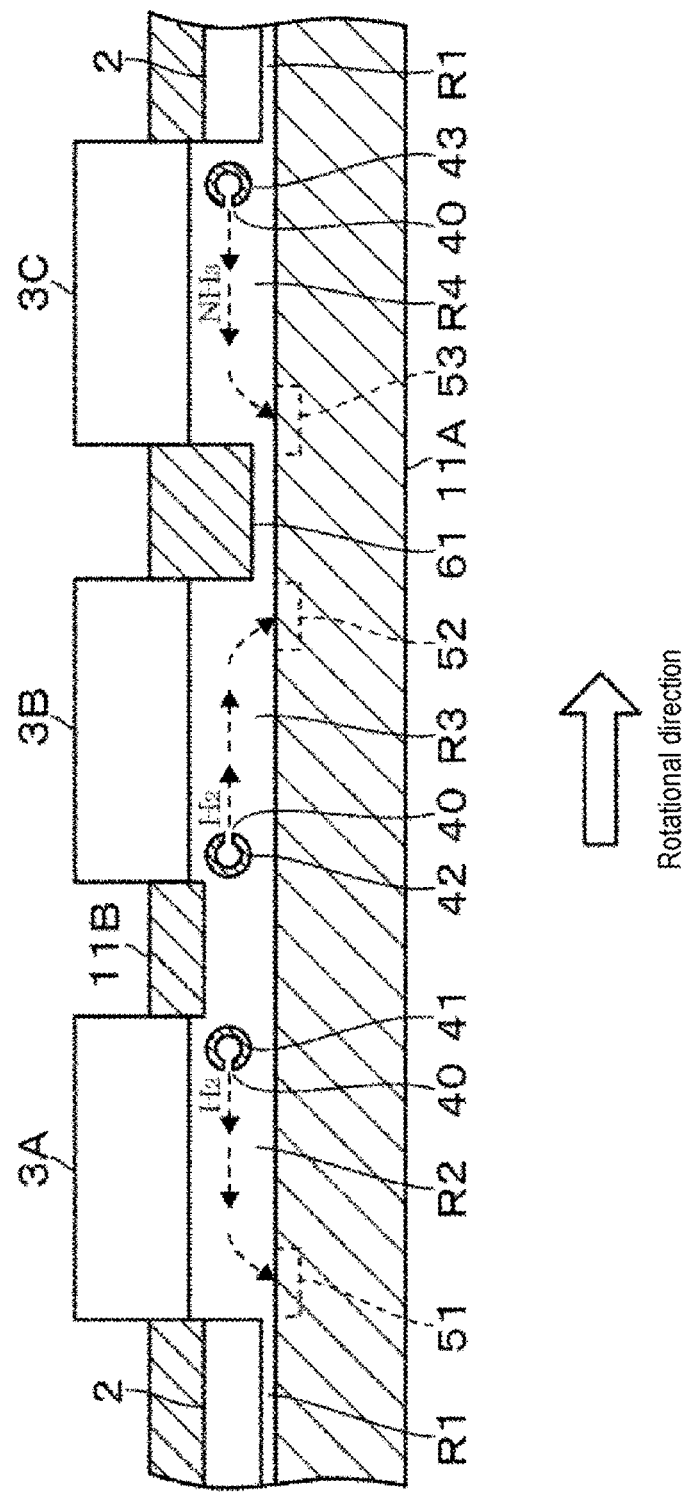
FIG. 6 is a longitudinal sectional view schematically illustrating a portion of the film forming apparatus.

As illustrated in FIGS. 2 and 6, the first modification region R2 is a fan-shaped region arranged at the downstream side in the rotational direction with respect to the aforementioned adsorption region R1. A first modifying gas injector 41 for discharging a modifying gas containing a hydrogen ($H_2$) gas toward the upstream side of the first modification region R2 is installed at an end on the downstream-side of the first modification region R2.

The second modification region R3 is a fan-shaped region arranged at the downstream side in the rotational direction with respect to the first modification region R2. A second modifying gas injector 42 for discharging a modifying gas containing a hydrogen ($H_2$) gas toward the downstream side of the second modification region R3 is installed at an end on the upstream-side of the second modification region R3.

The reaction region R4 is a fan-shaped region arranged at the downstream side in the rotational direction than the second modification region R3 with a separation region 61 to be described later interposed between the second modification region R3 and the reaction region R4. A reaction gas injector 43 for discharging a nitriding gas toward the upstream side of the reaction region R4 is installed at an end on the downstream-side of the reaction region R4.

The separation region 61 is a fan-shaped region in which the ceiling surface of the ceiling plate 11B is lower than the second modification region R3 and the reaction region R4 described above, and serves to separate atmosphere between the second modification region R3 and the reaction region R4.

Figure 5:
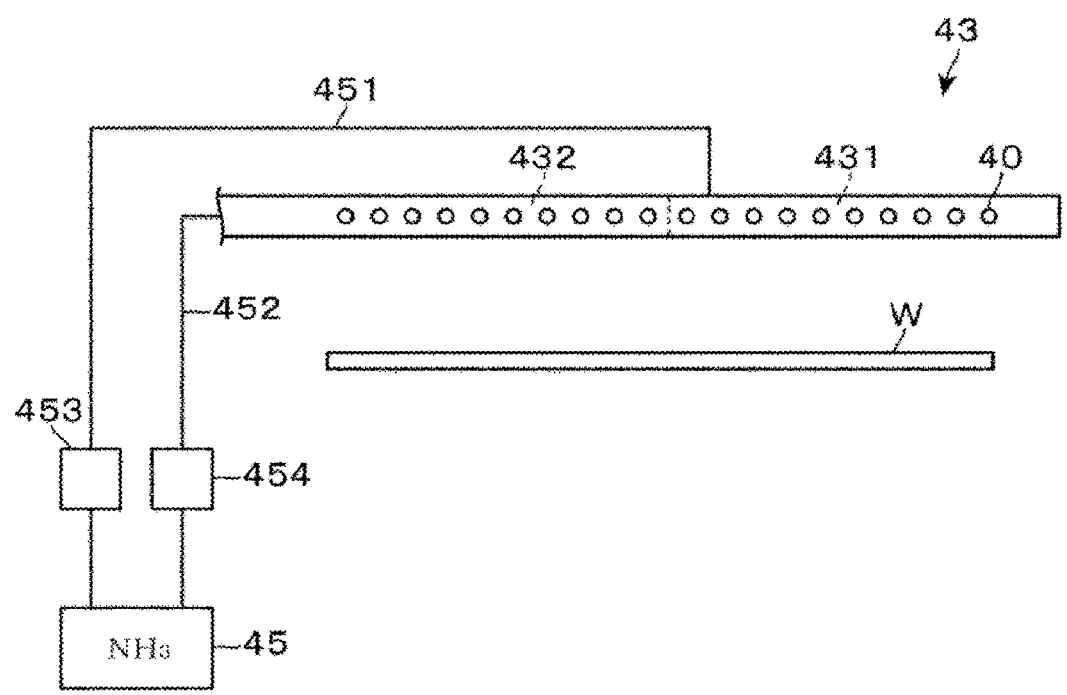
FIG. 5 is a side view illustrating an example of a reaction gas injector installed in the film forming apparatus.

The first and second modifying gas injectors 41 and 42 and the reaction gas injector 43 are configured in the same manner, and hereinafter, may be referred to as the gas injectors 41, 42, and 43. For example, as illustrated in FIGS. 1, 2, and 5, each of the gas injectors 41, 42, and 43 is configured by an elongated tubular body with a leading end closed. These gas injectors 41, 42, and 43 horizontally extend from the sidewall toward the central region of the vacuum container 11, and are disposed so as to intersect with a region through which the wafers W accommodated in the recesses 14 pass.

As illustrated in FIG. 2, a plurality of gas discharge ports 40 are installed in each of the gas injectors 41, 42, and 43 so as to be spaced apart from one another along the longitudinal direction of each of the gas injectors 41, 42, and 43. The gas is discharged from these discharge ports 40, for example, in a lateral direction. In each of the gas injectors 41, 42, and 43, the plurality of discharge ports 40 is disposed over the region through which the wafers W accommodated in the recesses 14 pass.

As illustrated in FIG. 2, the first and second reforming gas injectors 41 and 42 are connected to a modifying gas supply source 44 via pipe systems 441 having gas supply devices 442. The modifying gas containing an $H_2$ gas is turned into plasma by first and second plasma generating units 3A and 3B to be described later. By active species of the $H_2$ gas contained in the plasma, H is bonded to dangling bonds in the SiN film. Thus, introduction of chlorine (Cl) contained in a DCS gas is suppressed and a dense SiN film is formed. An Ar gas for assisting in the generation of plasma of the $H_2$ gas may be added to the modifying gas.

Each of the gas supply devices 442 has an opening/closing valve and a mass flow controller for controlling the supply/stop of the $H_2$ gas and the flow rate of the $H_2$ gas from the modifying gas supply source 44 to the first and second modifying gas injectors 41 and 42.

Next, as illustrated in FIG. 5, the interior of the reaction gas injector 43 of this example is divided into, for example, two portions in the longitudinal direction of the reaction gas injector 43. Hereinafter, the leading end side of the reaction gas injector 43 will be referred to as a first gas discharge region 431, and the base end side of the reaction gas injector 43 will be referred to as a second gas discharge region 432.

The respective gas discharge regions 431 and 432 are connected to a common nitriding gas supply source 45 via pipe systems 451 and 452 having gas supply devices 453 and 454, each of which includes an opening/closing valve and a mass flow controller. With this configuration, in the reaction region R4, it is possible for the first gas discharge region 431 and the second gas discharge region 432 to supply a nitriding gas toward a region close to the rotary axis X of the rotary table 12 and toward a region far from the rotary axis X, respectively, with different flow rates from each other. Alternatively, it is not an essential requirement to divide the reaction gas injector 43 in the longitudinal direction, and similar to the first and second modifying gas injectors 41 and 42, the nitriding gas may be supplied by using an undivided reaction gas injector 43.

The nitriding gas is supplied from the nitriding gas supply source 45 toward the wafers W mounted on the rotary table 12. For example, the nitriding gas contains at least one nitriding gas raw material selected from a group of nitriding gas raw materials consisting of ammonia ($NH_3$), nitrogen monoxide (NO), dinitrogen monoxide ($N_2O$), nitrogen dioxide ($NO_2$), and nitrogen ($N_2$).

In the present embodiment, an example of supplying a nitriding gas containing $NH_3$ from the nitriding gas supply source 45 will be described. An Ar gas for assisting generation of plasma of the $NH_3$ gas may be added to the nitriding gas. The nitriding gas containing $NH_3$ is turned into plasma by a third plasma generating unit 3C to be described later. By active species of the $NH_3$ gas contained in the plasma, silicon halide (DCS) adsorbed to the wafers W in the adsorption region R1 is nitrided and a molecular layer of SiN is formed.

In addition, as illustrated in FIG. 2, at an outer side of the rotary table 12, first to third exhaust ports 51 to 53 are respectively opened at a position facing the end on the upstream-side of the first modification region R2, at a position facing the end on the downstream-side of the second modification region R3, and at a position facing the end on the upstream-side of the reaction region R4. The first exhaust port 51 exhausts the modifying gas supplied from the first modifying gas injector 41 and flowing through the first modification region R2. The second exhaust port 52 exhausts the modifying gas supplied from the second modifying gas injector 42 and flowing through the second modification region R3. The third exhaust port 53 exhausts the nitriding gas supplied from the reaction gas injector 43 and flowing through the reaction region R4.

The first to third exhaust ports 51 to 53 are connected to, for example, a common exhaust device 54, via exhaust paths 511, 521, and 531, respectively.

An exhaust amount adjustment part (not shown) is installed in each of the exhaust paths 511, 521, and 531. Thus, the exhaust amounts from the first to third exhaust ports 51 to 53 can be, for example, individually adjusted.

In addition, the first plasma generating unit 3A, the second plasma generating unit 3B, and the third plasma generating unit 3C for activating the gases supplied to the respective regions are installed in the first modification region R2, the second modification region R3, and the reaction region R4 as described above. The first plasma generating unit 3A and the second plasma generating unit 3B constitute a plasma generating part for the modifying gas and the third plasma generating unit 3C constitutes a plasma generating part for the reaction gas.

Since the respective first to third plasma generating units 3A to 3C are configured in the same manner, the third plasma generating unit 3C illustrated in FIG. 1 will be representatively described herein. The plasma generating unit 3C supplies a microwave to the nitriding gas supplied from the reaction gas injector 43 to generate plasma of the nitriding gas. The plasma generating unit 3C includes a microwave supply part 31 for supplying the microwave. The microwave supply part 31 includes a dielectric plate 32 and a waveguide 33 made of metal.

The dielectric plate 32 corresponds to a planar shape of the reaction region R4, and has a fan shape which widens from the central side toward the peripheral side of the rotary table 12. A through hole corresponding to the shape of the dielectric plate 32 is formed in the ceiling plate 11B of the vacuum container 11. An inner peripheral surface of the lower end portion of the through hole slightly protrudes toward the central side of the through hole so as to form a support part 34. The dielectric plate 32 closes the through hole from the upper surface side with the peripheral edge portion of the dielectric plate 32 supported by the support part 34, and is disposed so as to face the rotary table 12.

The waveguide 33 is installed on the dielectric plate 32 and has an interior space 35 extending on the ceiling plate 11B. A slot plate 36 is installed at the lower surface side of the waveguide 33 so as to make contact with the dielectric plate 32 described above, and a plurality of slot holes 36A is formed in the slot plate 36. An end portion of the waveguide 33 at the central side of the rotary table 12 is closed, whereas an end portion at the peripheral edge side of the rotary table 12 is connected to a microwave generator 37. The microwave generator 37 supplies a microwave of, for example, about 2.45 GHz, to the waveguide 33.

The first and second plasma generating units 3A and 3B having the same configuration are also disposed in the first and second modification regions R2 and R3, respectively. The microwave supplied to the waveguide 33 passes through the slot hole 36A of the slot plate 36 and reaches the dielectric plate 32. The microwave is supplied below the dielectric plate 32 and applied to the modifying gas flowing toward the first and second exhaust ports 51 and 52. As a result, plasma of the modifying gas is generated only in the first and second modification regions R2 and R3.

Similarly, in the reaction region (nitridation region) R4, a microwave is applied to the nitriding gas flowing below the dielectric plate 32 toward the third exhaust port 53 by the third plasma generating unit 3C. Thus, plasma of the nitriding gas is generated only in the reaction region R4.

As illustrated in FIG. 1, a controller 10 configured as a computer is installed in the film forming apparatus 1, and a program is stored in the controller 10. This program has a group of steps organized to cause a control signal to be transmitted to each part of the film forming apparatus 1 and control the operation of each part so as to execute the film forming process to be described later.

Specifically, the program performs the control of the rotation number of the rotary table 12 per unit time by the rotation mechanism 13, the supply/stop and the flow rate control of each gas by each gas supply device, the control of exhaust amount by each of the exhaust devices 28 and 54, the supply/stop of microwaves from the microwave generator 37 to the microwave supply part 31, the adjustment of temperature for heating the wafers W by the heater 15, and the like. This program is installed in the controller 10 from a non-transitory computer-readable storage medium, such as a hard disk, a compact disc, a magneto-optical disc, a memory card or the like.

The inventors of the present disclosure found that the following problems occur due to interaction with substances existing on a base of an SiN film, in forming the SiN film by depositing the silicon nitride (SiN) obtained by nitriding silicon halide (DCS) adsorbed to the surface of the wafer W with an $NH_3$ gas (nitriding gas) using the film forming apparatus 1 having the aforementioned configuration.

As described in the background art, in order to form an SiN film with a small wet etching rate (WER) and good film quality on the surface of the wafer W on which the uneven pattern is formed, it is desirable that a dense SiN film be formed by sufficiently nitriding DCS at a relatively high temperature which falls within a range of, for example, 400 to 500 degrees C. Furthermore, the SiN film formed within such a temperature range may also have a sufficient film thickness inside the uneven pattern to obtain good step coverage (SC).

However, in some cases, metal reacting with chlorine (halogen) contained in the DCS to generate chloride (halide) is exposed on the surface of the wafer W on which the SiN film is formed. For example, when a SiN film is formed on an upper surface of a metal layer, which is formed to reduce a specific resistance of a gate electrode for high speed, within the temperature range of 400 to 500 degrees C. using the aforementioned film forming apparatus 1, it was found that the chlorine contained in the DCS may react with metal of the metal layer and generate metal chloride as a reaction product in some cases. The presence of the reaction product such as metal chloride between the SiN film and the base of the SiN film causes peeling-off of the SiN film after the film formation.

In the case where at least one metal selected from a group of metals consisting of titanium, tungsten, cobalt, and nickel is exposed on the base of the SiN film, it is likely that the metal reacts with silicon halide such as DCS and generates a reaction product.

Therefore, the inventors studied film formation within a temperature range of 200 to 400 degrees C., which is equal to or higher than a temperature (minimum film-forming temperature: about 200 degrees C.) at which a molecular layer of SiN is formed by reaction between DCS and a $NH_3$ gas and lower than a temperature (maximum film-forming temperature: about 400 degrees C. in the case of using metal included in the aforementioned metal group and DCS) at which a reaction product is generated by reaction between the metal of a base and the DCS, more suitably, at a temperature of 250 degrees C. which falls within a range of 200 to 300 degrees C.

However, it was found that when the film-forming temperature was lowered, nitridation of the DCS became insufficient, the density of the SiN film was decreased, and the WER was increased (see experimental results to be described later). In this case, even if wet etching is performed on the SiN film, the etching may ununiformly go ahead depending on a position of the uneven pattern (deterioration of etching conformality).

Furthermore, the deterioration of SC was also observed in the SiN film formed at a low film-forming temperature.

Therefore, the inventors have noted a nitridation time for nitriding the DCS with the $NH_3$ gas as a method of maintaining the film quality and SC of the SiN film in a good state while performing film formation at, for example, 250 degrees C., which is a temperature lower than the maximum film-forming temperature at which the reaction of the base metal of the SiN film and the DCS goes ahead.

That is to say, when the rotary table 12 is rotated more slowly than in a conventional method by adjusting the rotation number of the rotary table 12 per unit time by the rotation mechanism 13, the time for which the wafer W passes through the reaction region R4 increases, making it possible to sufficiently nitride the DCS.

On the other hand, when the rotation number of the rotary table 12 is reduced, the speed at which the molecular layer of SiN is deposited decreases and the time required to obtain an SiN film having a desired film thickness increases. Therefore, from the viewpoint of productivity, it is not desirable to unlimitedly reduce the rotation number of the rotary table 12 solely for the purpose of obtaining an SiN film with good film quality.

Taking these points into consideration, the present disclosure sets specific target values for (i) a target range (SC value range) of SC for the uneven pattern, and (ii) an upper limit value of WER (WER upper limit value) of the SiN film, and specifies the rotation number that satisfies the target values (i.e., a minimum nitridation time for which the wafer W passes through the reaction region R4).

This makes it possible to clarify the minimum rotation number necessary for obtaining an SiN film with good film quality, and to suppress excessive reduction in productivity.

The SC of this example is defined as a ratio of a film thickness (T2) of a silicon nitride film formed at the bottom of the uneven pattern to a film thickness (T1) of an SiN film formed at the top of the step of the uneven pattern ($\{T2/T1\} \times 100$ [%]), and the SC value range is set to a range of 95 to 140%.

The WER rate of this example is an etching rate when a silicon nitride film is etched with 1 vol % diluted hydrofluoric acid, and the WER upper limit value is set to a value of 20 Å/min or less. In this example, the WER upper limit value is 15 Å/min.

The rotation number of the rotary table 12 that can satisfy the SC value range of (i) and the WER upper limit value of (ii) as described above can be recognized by a preliminary experiment or the like. As indicated in experimental results in the examples to be described later, in the film forming apparatus 1 of this example, an SiN film is formed by setting the rotation number of the rotary table 12 to 3 rpm which falls within a range of, for example, 3 to 10 rpm. At this time, the sum of time (nitridation time) for each point on the surface of each wafer W to pass through the reaction region R4 while the rotary table 12 makes one rotation is about 10 seconds which falls within a range of 10 to 20 seconds.

For reference, the rotation number of the rotary table 12 at the start of the present study was set to 5 rpm (nitridation time: about 6 seconds).

The SC value range and the WER upper limit value may also be set by different definitions from those described above in this example. Even in the case of using the SC value range and the WER upper limit value set by different definitions, it is possible to determine the rotation number of the rotary table 12 based on common evaluation indexes by recognizing the correspondence relationship between the SC value range and the WER upper limit value described above in this example and the SC value range and the WER upper limit value of different definitions through preliminary experiment or the like.

In this example, the rotation number of the rotary table 12 is specified so that the SiN film formed on the uneven pattern satisfies both the SC value range and the WER upper limit value described above. However, the SiN film may be formed by rotating the rotary table 12 with the rotation number that satisfies arbitrary target values as necessary.

Figure 7:
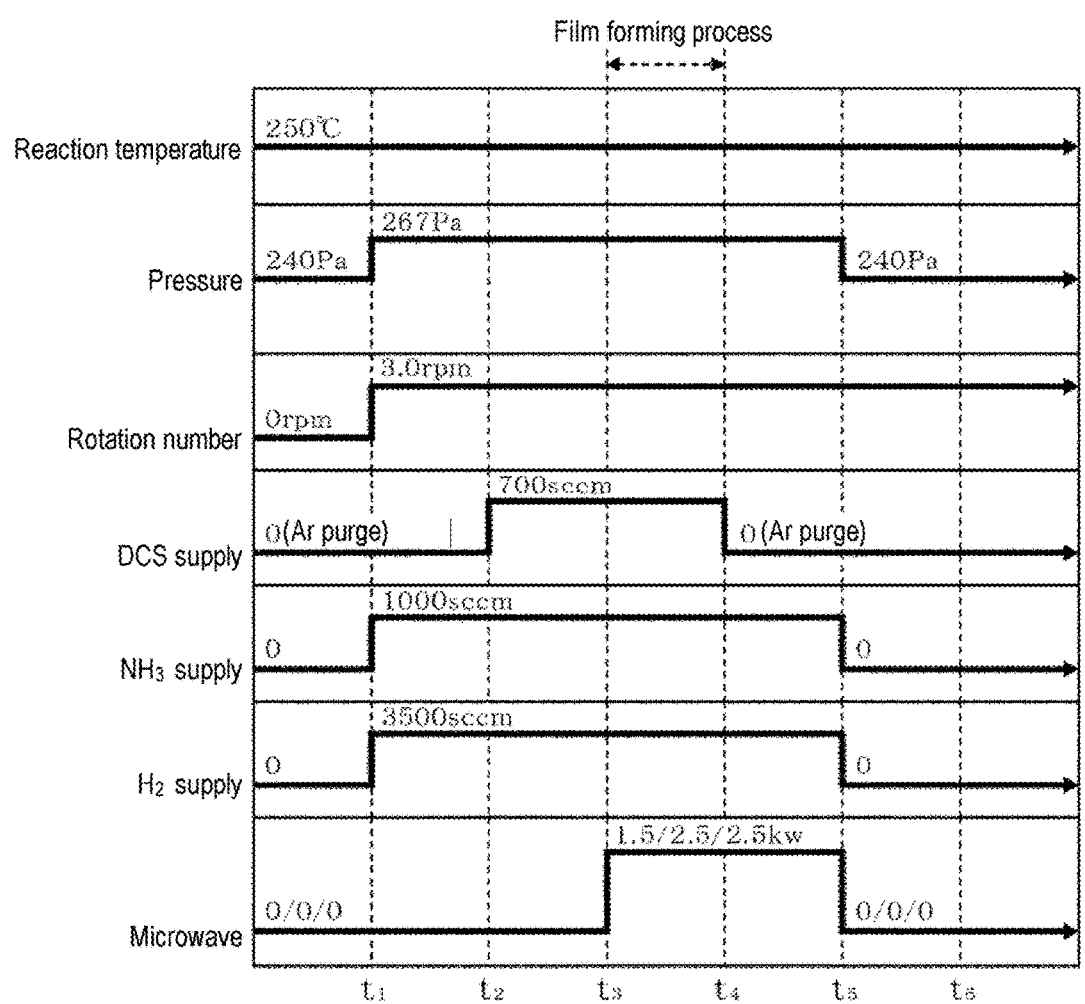
FIG. 7 is a time chart of a film forming process using the film forming apparatus.

Hereinafter, operation of the film forming apparatus 1 of this example will be described with reference also to a time chart of FIG. 7.

First, the gate valve (not shown) is opened. Then, by a substrate transfer mechanism disposed in an adjacent vacuum transfer chamber, a wafer W as a film forming target is carried in via the transfer port 16 and transferred to elevating pins (not shown), accommodating the wafer W in the recess 14. This operation is repeated while intermittently rotating the rotary table 12 to arrange wafers W in all the recesses 14.

Thereafter the substrate transfer mechanism is withdrawn from the interior of the vacuum container 11. After the gate valve is closed, pressure adjustment is performed to set the internal pressure of the vacuum container 11 to be, for example, 240 Pa (1.8 Torr), by the exhaust from the first to third exhaust ports 51, 52 and 53.

Furthermore, the wafers W mounted in the recesses 14 are heated to 250 degrees C. described above by the heater 15. At this time, only a purge gas (Ar gas) is supplied from the purge gas discharge port 23 in the gas supply/exhaust unit 2, and the purge gas flowing into the gap between the gas supply/exhaust unit 2 and the rotary table 12 is exhausted from the exhaust port 22.

Thereafter, at time $t_1$ when the pressure adjustment and temperature adjustment described above are completed, a modifying gas containing an $H_2$ gas of a total 3,500 sccm is supplied from the first and second modifying gas injectors 41 and 42 and a nitriding gas containing an $NH_3$ gas of 1,000 sccm is supplied from the reaction gas injector 43. The pressure adjustment is performed to change the set pressure in the vacuum container 11 to 267 Pa (2.0 Torr).

Then, at time $t_2$ when the supply flow rates of the modifying gas and the nitriding gas and the internal pressure of the vacuum container 11 are stabilized, a raw material gas containing DCS of 700 sccm is supplied to the gas supply/exhaust unit 2 to start discharge of the raw material gas from each gas discharge port 21 installed in the fan-shaped region 24.

Thereafter, at time $t_3$ when the supply flow rate of the raw material gas is stabilized, the film forming process starts by applying microwaves from the microwave generators 37 of respective plasma generating units 3A to 3C.

The raw material gas containing DCS is supplied to the wafer W mounted in each recess 14 when the wafer W passes through the adsorption region R1, and adsorbed to the surface of the wafer W (adsorption step). The nitriding gas ($NH_3$ gas) turned into plasma is supplied to the DCS adsorbed to the wafer W when the wafer W passes through the reaction region R4, and nitrides the DCS so as to form a molecular layer of SiN (nitridation step).

More specifically, in the gas supply/exhaust unit 2 installed in the adsorption region R1, the raw material gas discharged downward from each gas discharge port 21 in the fan-shaped region 24 reaches the surface of the wafer W and the DCS is adsorbed to the surface of the uneven pattern.

An excess raw material gas is exhausted from the exhaust port 22 installed around the fan-shaped region 24.

In addition, a portion of the purge gas supplied from the purge gas discharge port 23 flows into the exhaust port 22 side so as to form a flow discharged together with the raw material gas around the exhaust port 22. Thus, the raw material gas hardly flows out to the outside of the region surrounded by the exhaust port 22.

Furthermore, the purge gas is injected to the surface of the wafer W when the wafer W having DCS adsorbed thereto passes below the purge gas discharge port 23. This also makes it possible to remove the remaining DCS after the adsorption.

In the first modification region R2, the modifying gas containing an $H_2$ gas is horizontally discharged from the first modifying gas injector 41 disposed along the end on the downstream side toward the upstream side in the rotational direction. Since this modifying gas is exhausted from the first exhaust port 51 installed outside the end on the upstream side of the first modification region R2, the modifying gas flows to be spread over the entire first modification region R2 (FIG. 6).

When the $H_2$ gas is turned into plasma by applying a microwave to the modifying gas, H may be bonded to dangling bonds in a molecular layer of SiN sequentially deposited on the surface of the wafer W. Thus, it is possible to suppress introduction of chlorine contained in DCS and form a dense SiN film.

In the second modification region R3, the modifying gas containing an $H_2$ gas is horizontally discharged from the second modifying gas injector 42 disposed along the end on the upstream side toward the downstream side in the rotational direction. Since this modifying gas is exhausted from the second exhaust port 52 installed outside the end on the downstream side of the second modification region R3, the modifying gas flows to be spread over the entire second modification region R3. Similar to the modifying gas supplied to the first modification region R2, this modifying gas modifies SiN deposited on the surface of the wafer W.

At this time, a portion of the modifying gas flowing through the first and second modification regions R2 and R3 side flows into the separation region 61, but the separation region 61 is formed to have a lower ceiling and smaller conductance than the surroundings. Therefore, most of the modifying gas is drawn back by the suction force of the second exhaust port 52 and is exhausted to the second exhaust port 52.

In the reaction region R4, a nitriding gas containing an $NH_3$ gas is horizontally discharged from the reaction gas injector 43 disposed along the end on the downstream side toward the upstream side in the rotational direction. Since this nitriding gas is exhausted from the third exhaust port 53 installed outside the end on the upstream side of the reaction region R4, the nitriding gas flows to be spread over the entire reaction region R4.

When the $NH_3$ gas is turned into plasma by applying a microwave to the nitriding gas supplied to the reaction region R4, the DCS adsorbed to the surface of the uneven pattern of the wafer W is nitrided and a molecular layer of SiN is formed.

By alternately repeating the adsorption step and the nitridation step described above, it is possible to deposit a molecular layer of SiN and form an SiN film having a desired film thickness.

Moreover, as described above, in the film forming apparatus 1 of this example, since a film is formed at 250 degrees C., which is lower than the maximum film-forming temperature at which the reaction between the metal layer on the base of the SiN film and chlorine contained in the DCS goes ahead and also lower than a conventional film-forming temperature (for example, 400 to 500 degrees C.), it is difficult to make the nitridation of the DCS go ahead.

Therefore, as indicated in experimental results in the examples to be described later, target values of the SC value range (95 to 140%) and the WER upper limit value (20 Å/min) are set, and the rotation number of the rotary table 12 per unit time (3 rpm in this example) that satisfies these target values at the film-forming temperature is specified. The formation of the SiN film is performed under these conditions.

As a result, by allowing the wafer W to slowly pass through the reaction region R4, the DCS can be sufficiently nitrided even under film-forming conditions of relatively low temperature and an SiN film with good SC and good film quality is formed.

At time $t_4$ when the aforementioned film forming process is performed for a preset period of time, the supply of DCS is stopped, while the supply of the modifying gas, the supply of the nitriding gas, and the application of microwave are continued to perform a post processing to sufficiently nitride the DCS.

Then, at time $t_5$ after a lapse of a predetermined period of time, the supply of the modifying gas, the supply of the nitriding gas, the application of the microwave are stopped, and the internal set pressure of the vacuum container 11 is returned to 240 Pa (1.8 Torr). Thereafter, at time $t_6$ when the internal pressure of the vacuum container 11 is stabilized, each wafer W for which the film forming process has been completed is unloaded in a reverse order of loading the wafer W. Then, the film forming apparatus 1 waits for a next wafer W to be loaded.

According to the film forming apparatus 1 of the present embodiment, the following effects may be achieved. Since the film forming process is performed under a condition of heating a substrate to a film-forming temperature (for example, 250 degrees C.) lower than the maximum film-forming temperature (for example, 400 degrees C. in the case of using metal contained in the metal group described above and DCS) at which the reaction between the base of the metal layer exposed on the surface of the wafer W and DCS goes ahead, it is possible to suppress generation of a reaction product (for example, metal chloride) caused by the reaction between the base of the metal and the DCS.

In addition, specific target values of SC and WER (an SC value range and a WER upper limit value) are set for the uneven pattern formed on the wafer W and a minimum nitridation time at which the SiN film as formed satisfies these target values is secured, thereby obtaining the SiN film with good film quality.

Here, the aforementioned film forming process is not limited to the case of using the film forming apparatus 1 having the configuration described above with reference to FIGS. 1 to 6. For example, the separation region 61 may also be arranged between the adsorption region R1 and the first modification region R2 to separate these regions, and an SiN film may be formed using a film forming apparatus in which a DCS gas is supplied by a gas injector instead of the gas supply/exhaust unit 2.

Furthermore, the method of turning the modifying gas or the nitriding gas into plasma is not limited to the example using the microwave, and instead, inductively coupled plasma (ICP) may be generated using an antenna.

The film forming process of this example is not limited to be applied to a case of using the so-called semibatch-type film forming apparatus 1, in which a molecular layer of SiN is deposited by allowing each wafer W to pass through the region (the adsorption region R1 or the reaction region R4 in FIG. 2) where a raw material gas or a nitriding gas is supplied by rotating the rotary table 12 on which a plurality of wafers W are loaded.

Figure 8:
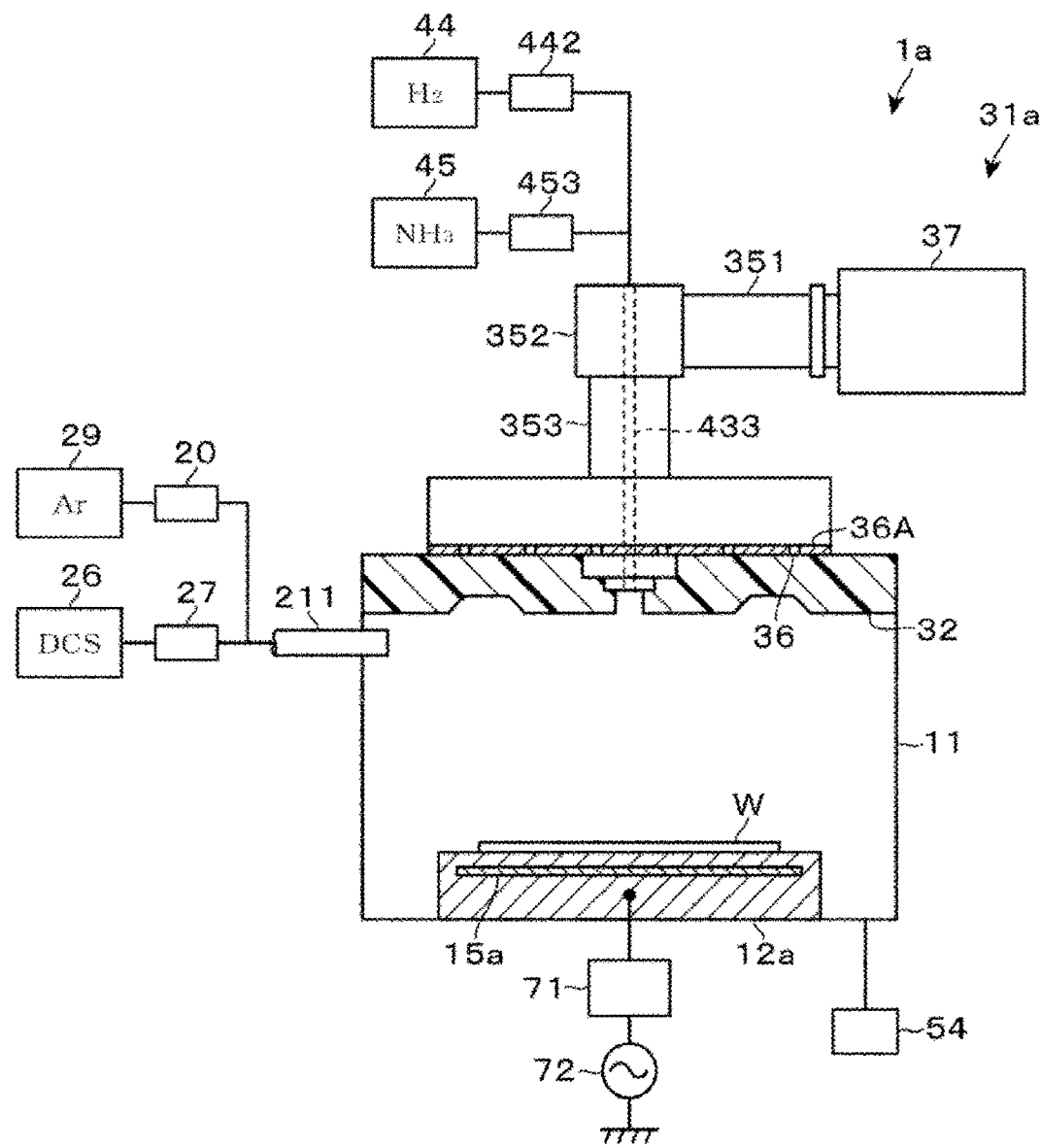
FIG. 8 is a longitudinal sectional view of a film forming apparatus according to a second embodiment of the present disclosure.

For example, as schematically illustrated in FIG. 8, the film forming process of this example may also be applied to a case of using a single-wafer-type film forming apparatus 1a that deposits a molecular layer of SiN by switchedly supplying a raw material gas, a nitriding gas, and the like into a vacuum container 11 accommodating a single wafer W.

In the film forming apparatus 1a illustrated in FIG. 8, the components having the same functions as those of the semibatch-type film forming apparatus 1 described above with reference to FIGS. 1 to 6 are denoted by the same reference numerals as those indicated in theses drawings.

A support part 12a for mounting a wafer W as a film-forming target is installed in the vacuum container 11 of the single-wafer-type film forming apparatus 1a illustrated in FIG. 8, and a high frequency power source 72 for applying a high frequency power (for example, 13.56 MHz) for bias is connected to the support part 12a via a matching unit 71.

A heater 15a is installed in the support part 12a to heat the wafer W mounted on the support part 12a to, for example, 250 degrees C., which falls within a range of equal to or higher than the minimum film-forming temperature and lower than the maximum film-forming temperature described above.

A nitriding gas containing $NH_3$ supplied from the nitriding gas supply source 45 and a modifying gas containing $H_2$ supplied from the modifying gas supply source 44 are turned into plasma by a microwave supplied into the vacuum container 11 using a microwave supply part 31a.

The microwave supply part 31a illustrated in FIG. 8 supplies a microwave of a TE mode of, for example, 2.45 GHz, generated by the microwave generator 37 to a mode converter 352 via the waveguide 351, and converts the microwave into a TEM mode. Then, the microwave is supplied into the vacuum container 11 via a coaxial waveguide 353, the slot plate 36 having the slot holes 36A formed on the slot plate 36, and the dielectric plate 32. Thus, the nitriding gas or the modifying gas described above is turned into plasma.

At this time, the nitriding gas and the modifying gas are introduced into the vacuum container 11 using a gas supply line 433 formed in the mode converter 352 and the coaxial waveguide 353.

A raw material gas containing DCS supplied from the raw material gas supply source 26 and an Ar gas (purge gas) supplied from the Ar gas supply source 29 are supplied into the vacuum container 11 via a gas supply pipe 211.

Using the film forming apparatus 1a having the aforementioned configuration, for example, the internal pressure of the vacuum container 11 is adjusted to 267 Pa (2.0 Torr) while supplying the purge gas. Then, by repeating the supply of each gas in the cycle of, for example, "raw material gas supply→purge gas supply→modifying gas supply (plasmarization)→purge gas supply→nitriding gas supply (plasmarization)→purge gas supply→raw material gas supply→ . . . ," a molecular layer of SiN is deposited on the surface of the wafer W a SiN film is formed.

At this time, similar to the film forming process in the aforementioned film forming apparatus 1, the minimum nitridation time that can satisfy both the SC value range and the WER upper limit value is specified in advance. Then, in the film forming apparatus 1a of this example, it is possible to form a SiN film that satisfies the target values of the SC value range and the WER upper limit value by supplying plasma of the nitriding gas over a time longer than the minimum nitridation time.

EXAMPLES

Experiment 1

In forming a SiN film on a surface of an uneven pattern using the film forming apparatus 1, the influence of the rotation number of the rotary table 12 per unit time on the film quality of the SiN film was investigated.

A. Experimental Conditions

A SiN film was formed on a surface of a wafer W on which an uneven pattern of a metal layer was formed and on a surface of a wafer W on which no uneven pattern was formed using the film forming apparatus 1 described above with reference to FIGS. 1 to 6. In the formation of the SiN film, the SiN film was formed based on the time chart shown in FIG. 7 except that the rotation number of the rotary table 12 was changed between the respective examples (where the time period of the film forming process was about 30 minutes).

Example 1-1

A SiN film was formed by setting the rotation number per unit time to 3 rpm, and the film formation state of the SiN film was observed by a scanning electron microscope (SEM). An SC value ($\{T2/T1\}\times100$ [%]), which is a ratio of a film thickness T2 of the silicon nitride film formed at the bottom of an uneven pattern to a film thickness T1 of the silicon nitride film formed at the top of the uneven pattern, was calculated. In addition, etching uniformity (etching conformality) in the uneven pattern when the SiN film formed on the uneven pattern was etched with 1 vol % diluted hydrofluoric acid, and WER [Å/min], which is an etching amount per unit time when the SiN film (blanket film) formed on the surface of the wafer W on which no uneven pattern was formed was etched with 1 vol % diluted hydrofluoric acid, were obtained.

Examples 1-2 and 1-3

Under the same conditions as those of Example 1-1, except that the rotation number of the rotary table 12 per unit time was set to 4 rpm and 5 rpm, a SiN film was formed and an SC value, etching uniformity in an uneven pattern, and WER were obtained.

B. Experimental Results

Figure 9A:
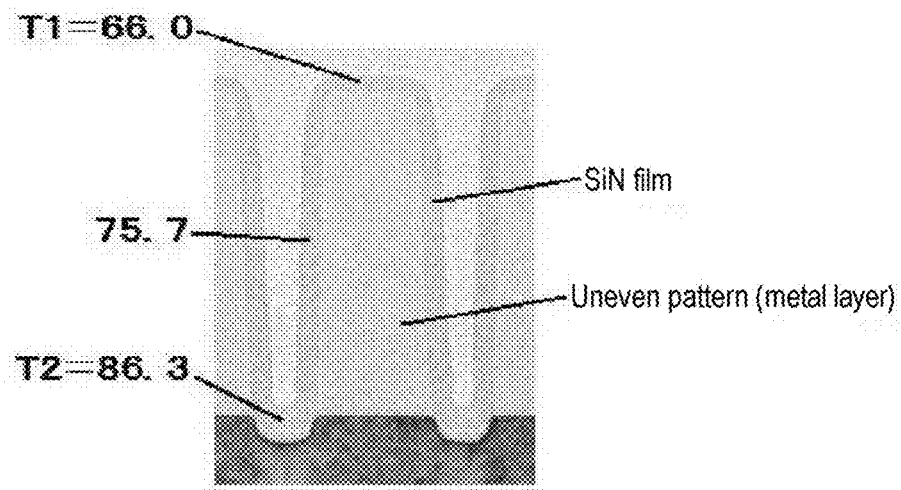
FIGS. 9A to 9C are explanatory diagrams showing results of examples.
Figure 9B:
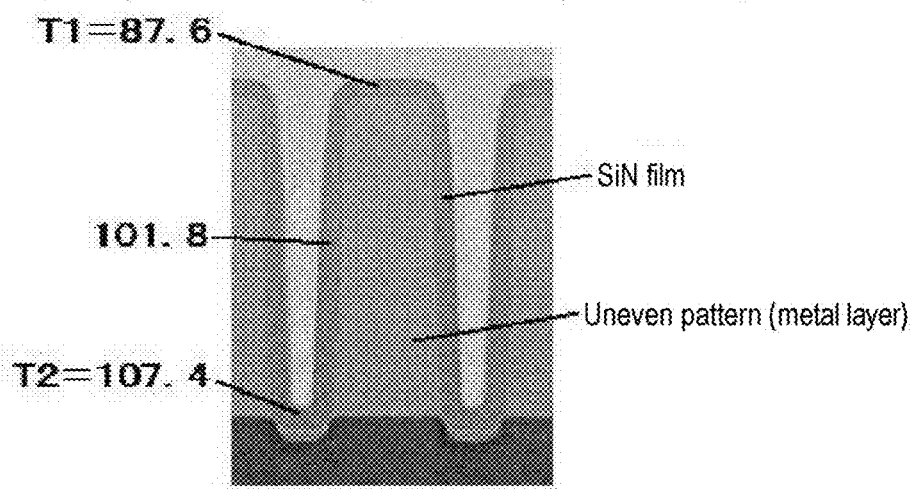
Figure 9C:
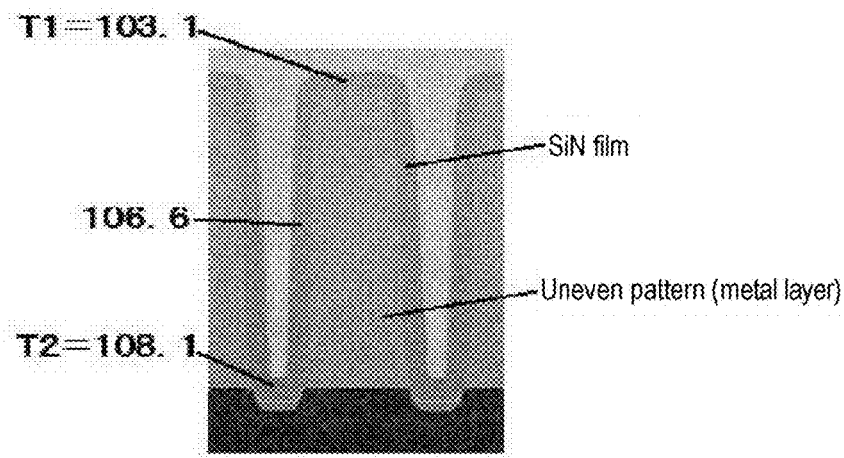

SEM photographs of Examples 1-1 to 1-3 are shown in FIGS. 9A to 9C, and SC values, evaluation results (OK or NG) of etching uniformity, and WERs are indicated in Table 1.

TABLE 1

|  | Example 1-1 | Example 1-2 | Example 1-3 |
| --- | --- | --- | --- |
| SC value [%] | 130.7 | 122.5 | 104.9 |
| Etching conformality | OK | NG | NG |
| WER [Å/min] | 9.3 | 10.9 | 14.7 |
| Protective film use evaluation | ◎ | ○ | Δ |

As a result of forming a SiN film on the uneven pattern of the metal layer by setting the film-forming temperature at 250 degrees C., in any of Examples 1-1 to 1-3, no generation of a reaction product such as metal chloride was observed and no peeling-off of the SiN film occurred.

The SC value of Example 1-1 was 130.7%, which is included in the target range of 95 to 140%. As a result of etching the SiN film formed in the uneven pattern with diluted hydrofluoric acid, the SiN film was substantially uniformly etched at different positions on the top, side, and bottom of the uneven pattern (etching conformality: OK, and illustration of etching results is omitted). The WER of the SiN film (blanket film) of Example 1-1 was 9.3 Å/min, which is less than the WER upper limit value (20 Å/min).

Also in Examples 1-2 and 1-3 in which the rotation number of the rotary table 12 per unit time was larger than that in Example 1-1, the SC value was a value within the target range (Example 1-2: 122.5%, and Example 1-3: 104.9%), the WER was less than the upper limit value (Example 1-2: 10.9 Å/min, and Example 1-3: 14.7 Å/min).

On the other hand, in Example 1-2, as a result of etching the SiN film formed in the uneven pattern with diluted hydrofluoric acid, the etching of the SiN film rapidly went ahead in a region on the bottom of the pattern and on the bottom-side side surface of the pattern. Thus, the base was slightly exposed. At this time, the SiN film remained in a region on the top of the uneven pattern and on the top-side side surface of the pattern (etching conformality: NG, and illustration of etching results are omitted).

Similarly, in Example 1-3, the etching of the SiN film rapidly went ahead in a region on the bottom of the pattern and on the bottom-side side surface of the pattern. Thus, exposure of the base was observed. However, the degree of exposure was larger than that in Example 1-2 (etching conformality: NG, and illustration of etching results are omitted).

In summary of the above experimental results, the evaluation of SC value and WER in all of Examples 1-1 to 1-3 satisfies requirements as a protective film against wet etching.

When further considering the evaluation of etching conformality based on the state after the wet etching, as indicated in Table 1, Example 1 having the smallest rotation number of the rotary table 12 shows the highest evaluation result as the protective film. In Examples 1-2 and 1-3, as the rotation number increases, the etching conformality deteriorated, and accordingly, the evaluation decreased as the protective film slightly deteriorated. However, as already described, the etching conformality is an index for obtaining a protective film of higher quality, and Examples 1-2 and 1-3 also satisfy the requirements of SC value and WER.

Experiment 2

A SiN film was formed by changing the film-forming temperature and the influence of the SiN film on WER was investigated.

A. Experimental Conditions

Change in WER [Å/min] of a SiN film (blanket film) formed by changing the film-forming temperature under the same conditions as those in Example 1-1 (the rotation number of the rotary table 12 per unit time is 3 rpm) was obtained.

Example 2-1

A WER was obtained for a film formed by setting the film-forming temperature at 250, 300, and 400 degrees C., by the same method as in Example 1-1.

Comparative Example 2-1

WERs of films formed by setting the film-forming temperature at 450, 500, and 550 degrees C., respectively, were obtained by the same method as in Example 1-1.

B. Experimental Results

Figure 10:
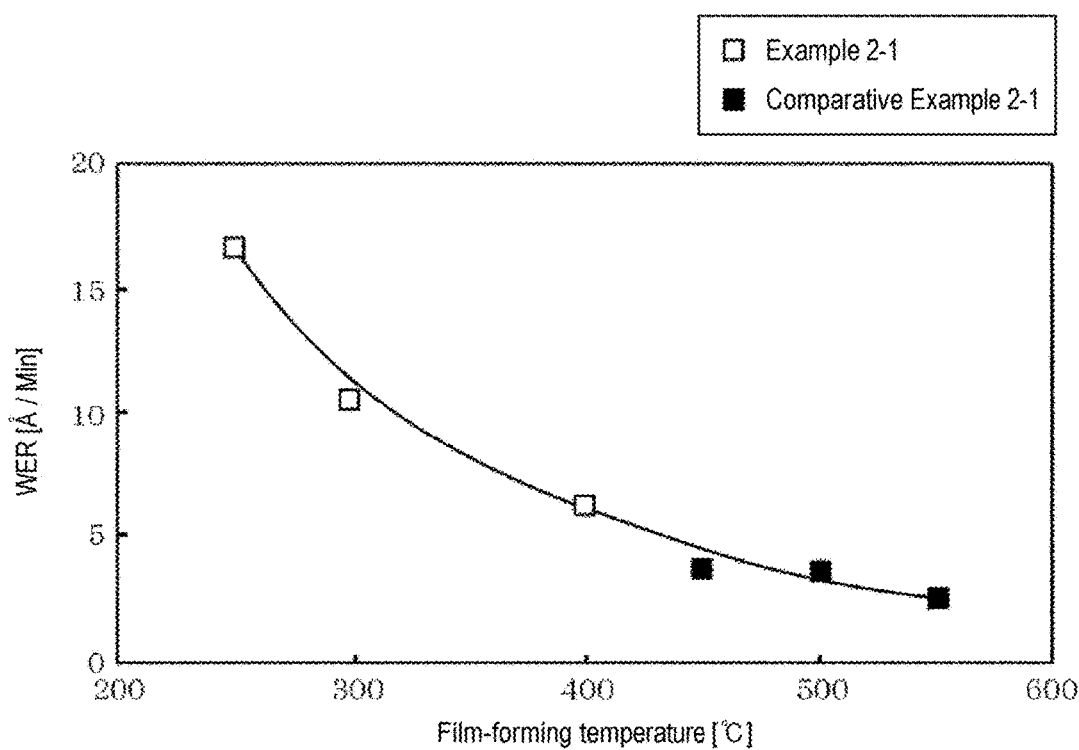
FIG. 10 is an explanatory diagram showing a change in film thickness with respect to a reaction temperature

FIG. 10 shows WERs of SiN films formed at respective film-forming temperatures of Example 2-1 and Comparative Example 2-1. In the graph of FIG. 10, the horizontal axis represents a film-forming temperature and the vertical axis represents WER. In addition, in the graph of FIG. 10, each WER for Example 2-1 is plotted with white squares, and each WER for Comparative Example 2-1 is plotted with black squares.

As indicated by a trend line in FIG. 10, it can be seen that when the film-forming temperature at which the experiments of Example 2-1 and Comparative Example 2-1 were conducted is within a range of 200 to 550 degrees C., there is a monotonously decreasing relationship in which the WER decreases as the film-forming temperature increases.

The WER value tends to be smaller as the SiN film becomes denser. Thus, the results of Example 2-1 and Comparative Example 2-1 shown in FIG. 10 indicate that a denser SiN film can be formed as the film-forming temperature increases.

In this regard, the value of WER ranged about 6 to 17 Å/min within the temperature range of Example 2 (250 to 400 degrees C.) that suppresses generation of the reaction product. This value is equal to or less than the WER upper limit value (20 Å/min). Thus, the SiN film has characteristics that can be used as a hard mask, a spacer insulating film, a sealing film, or the like.

When the film-forming temperature is further increased, the value of WER becomes further smaller. Thus, in view of the SiN film only, it can be evaluated that a denser film is formed than in Example 2-1. However, as already described above, when the film-forming temperature exceeds 400 degrees C., a problem in which the reaction product is generated by reaction of metal in the base side and halogen contained in the raw material gas (in this example, metal chloride caused by reaction of chlorine contained in DCS and the metal layer) occurs.

From these results of Examples and Comparative Examples, it could be confirmed that there is a combination of a film-forming temperature and a nitridation time (the rotation number of the rotary table 12 per unit time), which can form a SiN film having a suitable WER value while suppressing generation of a reaction product.

According to the present disclosure, a film forming process is performed under a condition that a substrate is heated to a film-forming temperature lower than a maximum film-forming temperature at which reaction of a base of metal exposed on a surface of the substrate and silicon halide goes ahead. Thus, it is possible to suppress generation of a reaction product caused by reaction of the metal and the silicon halide.

In addition, specific target values of step coverage and wet etching rate are set for an uneven pattern formed on a substrate, and a minimum nitridation time that allows the film as formed to satisfy the target values is ensured. Thus, it is possible to obtain a silicon nitride film with good film quality.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon nitride film, comprising:
   a film forming process of forming the silicon nitride film by depositing a molecular layer of silicon nitride on a surface of a substrate, in which an uneven pattern is formed and a base made of metal reacting with halogen is exposed, by alternately performing:
      adsorbing silicon halide to the surface of the substrate by supplying a raw material gas containing silicon halide to the surface of the substrate; and
      nitriding the silicon halide by supplying a plasmaized nitriding gas to the surface of the substrate to which the silicon halide is adsorbed,
   wherein the film forming process is performed under a condition in which the substrate is heated at a film-forming temperature, the film-forming temperature falling within a range of equal to or higher than a minimum film-forming temperature at which the molecular layer of the silicon nitride is formed by reaction of the silicon halide and the plasmarized nitriding gas and less than a maximum film-forming temperature at which the reaction of the base made of metal and the silicon halide goes ahead, and
   wherein the act of nitriding the silicon halide is performed over a time equal to or longer than a minimum nitridation time, the minimum nitridation time satisfying at least one of (i) making a step coverage (SC) of the silicon nitride film for the uneven pattern be a value within a predetermined SC value range and (ii) making a wet etching rate (WER) of the silicon nitride film be a value equal to or less than a predetermined WER upper limit value.

2. The method of claim 1, wherein the silicon halide is at least one silicon halide selected from a group of silicon halides consisting of dichlorosilane, hexachlorodisilane, tetrachlorosilane, and trichlorosilane, and
   wherein the metal is at least one metal selected from a group of metals consisting of titanium, tungsten, cobalt, and nickel.

3. The method of claim 1, wherein the nitriding gas contains at least one nitriding gas raw material selected from a group of nitriding gas raw materials consisting of ammonia, nitrogen monoxide, dinitrogen monoxide, nitrogen dioxide, and nitrogen.

4. The method of claim 1, wherein the step coverage is a ratio ($\{T2/T1\} \times 100$ [%]) of a film thickness (T2) of the silicon nitride film formed at a bottom portion of the uneven pattern to a film thickness (T1) of the silicon nitride film formed at a top portion of the uneven pattern, and the SC value range is set to a range of 95 to 140%.

5. The method of claim 1, wherein the wet etching rate is an etching rate when the silicon nitride film is etched with 1 vol % diluted hydrofluoric acid, and the WER upper limit value is set to a value of 20 Å/min or less.

6. The method of claim 1, wherein the film forming process includes alternately performing the act of adsorbing the silicon halide and the act of nitriding the silicon halide by:
   rotating a rotary table, which is installed in a vacuum container and has a substrate mounting region on which the substrate is mounted, so as to revolve the substrate mounted on the substrate mounting region around a center of rotation of the rotary table; and
   allowing the substrate mounted on the substrate mounting region to pass through a supply region of the silicon halide and a supply region of the plasmarized nitriding gas installed to be spaced apart from each other along a direction in which the substrate revolves, and
   wherein a rotation number of the rotary table per unit time is adjusted such that the substrate mounted on the substrate mounting region passes through the supply region of the plasmarized nitriding gas over a time equal to or longer than the minimum nitridation time.

7. A non-transitory computer-readable storage medium storing a computer program for use in a film forming apparatus for forming a silicon nitride film on a substrate arranged in a vacuum container, wherein the computer program is configured to perform a control to execute the method of forming a silicon nitride film of claim 1.

\* \* \* \* \*